(12) United States Patent
Ganesh et al.

(10) Patent No.: US 8,248,168 B2
(45) Date of Patent: Aug. 21, 2012

(54) PID CONTROL FOR TRANSMITTER-RECEIVER SYNCHRONIZATION

(75) Inventors: Shanmugasundaram Ganesh, Bangalore (IN); Dominic Pushparaj, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/004,215

(22) Filed: Jan. 11, 2011

(65) Prior Publication Data
US 2012/0176201 A1 Jul. 12, 2012

(51) Int. Cl.
*H03L 7/00* (2006.01)
(52) U.S. Cl. ............... 331/16; 331/1; 331/34; 455/260; 327/156; 327/159
(58) Field of Classification Search ............... 331/1 A, 331/16, 34; 455/260; 327/156, 159
See application file for complete search history.

(56) References Cited

U.S. PATENT DOCUMENTS
7,893,775 B2 * 2/2011 Luiz et al. .................... 331/25
2010/0020912 A1 1/2010 Lesso

OTHER PUBLICATIONS

Hayri Ugar Uyanik and Nil Tarim, PID-Controlled PLL for Fast Frequency-Hopped Systems, pp. 978-980.
Liming Xiu, A Novel DCXO Module for Clock Synchronization in MPEG2 Transport System, pp. 2226-2237, IEEE Transactions on Circuits and Systems-I. Regular Papers, vol. 55 No. 8 Sep. 2008.

* cited by examiner

*Primary Examiner* — Arnold Kinkead

(57) ABSTRACT

Various embodiments relate to a receiver and a timing circuit for synchronization between a transmitter clock of an MPEG stream and the local system clock of a receiver. The timing circuit may implement a phase-locked loop (PLL) circuit with a PID controller to produce a control signal based on the difference between the transmitter reference clock and the local system clock. Various embodiments may use clock differential signals and an accumulated error signal to produce proportional, integral, and derivative output components for a control signal. The control signal may control a signal generator that adjusts the frequency and/or phase of the local signal clock to lock with the transmitter reference clock. Various embodiments may also include an outlier filter to remove error signals outside a defined range and/or a programmable system clock to add precision to the generated local system clock.

18 Claims, 5 Drawing Sheets

PID CONTROL FOR TRANSMITTER-RECEIVER SYNCHRONIZATION

TECHNICAL FIELD

Various exemplary embodiments disclosed herein relate generally to multimedia transmitter-receiver synchronization.

BACKGROUND

In communications systems, synchronization between devices may be of very high importance. For example, a communications system may require adequate functionality of various features, such as video playback, across devices through wire-line or wireless communication. To enable such playback, the system may employ one or more communications standards to ensure functionality, which may require high synchronization between devices. Without such standards, insufficient synchronization may lead to problems in functionality; for example, a communications system that enables video playback with insufficient synchronization may experience drift between the audio and video components of audio-visual material, especially if the devices are wirelessly connected to the video playback device.

Standards such as those implemented by the Moving Picture Experts Group (MPEG), such as the MPEG-2 coding standard for video and associated audio, may be used to specify the storage and transmission of audio-visual material. The MPEG-2 standard, for example, specifies separate audio, visual, and system coding layers to enable operations between component devices by transmitting MPEG-2 streams. Even with such standards, however, existing control systems may not effectively enable sufficient synchronization for the purposes of audio and video playback in various environments, such as audio and video playback within a motor vehicle.

In view of the foregoing, it would be desirable to synchronize devices communicating through MPEG streams in a communications system. In particular, it would be desirable to synchronize the timing between a transmitter of an MPEG stream with the timing of a receiver of the MPEG, adjusting for timing errors between the devices.

SUMMARY

In light of the present need for synchronization between a receiver clock and a transmitter clock, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may relate to a phase-locked loop (PLL) circuit for transmitter-receiver synchronization. The circuit may comprise a phase detector that produces an error signal based on a difference between a reference clock signal and a local clock signal. The circuit may also comprise a proportional-integral-derivative (PID) controller that receives the error signal from the phase detector and produces a correction signal. The circuit may also comprise a signal generator that produces a local clock signal based on the correction signal received from the PID controller and a feedback counter that increments based on the received local clock signal to produce a modified local clock signal for the phase detector.

Various embodiments may also relate to a method of using a phase-locked loop (PLL) circuit for transmitter-receiver synchronization. The method may comprise producing, by a phase detector, an error signal based on a difference between a reference clock signal and a local clock signal. The method may also comprise producing, by a proportional-integral-derivative (PID) controller, a correction signal based on the error signal received from the phase detector. The method may also comprise producing, by a clock signal generator, a local clock signal based on the correction signal received from the PID controller and producing, by a feedback counter, a modified local clock signal for the phase detector by incrementing based on the local clock signal received from the clock signal generator.

Various embodiments may also relate to a circuit for transmitter-receiver synchronization comprising a phase detector that produces an error signal based on a difference between a reference clock signal and a local clock signal and a filter that receives the error signal from the phase detector and produces a modified signal. The circuit may also comprise a proportional-integral-derivative (PID) controller that receives the modified signal from the filter and produces a correction signal, a clock signal generator that produces a system clock signal based on the correction signal received from the PID controller, and a feedback counter that produces a local clock signal based on the system clock signal.

It should be apparent that, in this manner, various exemplary embodiments enable enhanced control for synchronization between communications devices. Particularly, by using a PID controller to compensate for a calculated error signal, the control circuit in a receiver may eliminate timing discrepancies that may occur between the transmitter and the receiver of an MPEG stream.

BRIEF DESCRIPTION OF THE DRAWINGS

In order to better understand various exemplary embodiments, reference is made to the accompanying drawings wherein.

DETAILED DESCRIPTION

Figure 1:
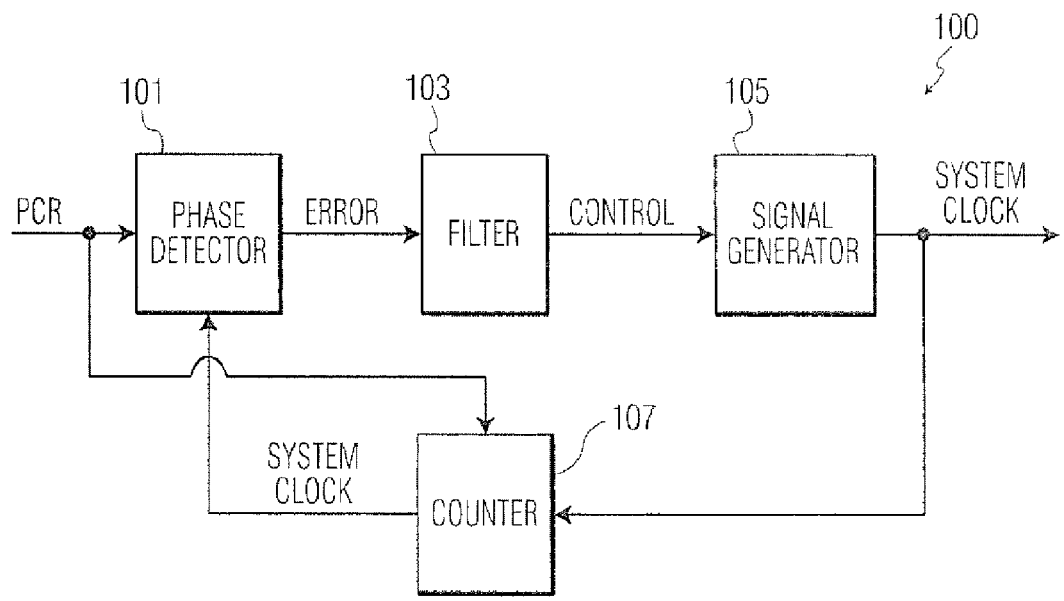
FIG. 1 illustrates an exemplary timing circuit in a receiver.

Referring now to the drawings, in which like numerals refer to like components or steps, there are disclosed broad aspects of various exemplary embodiments.

FIG. 1 illustrates an exemplary timing circuit in a receiver. Timing circuit 100 may enable synchronization between clocks of different devices by accounting for drifts between a reference clock and the system clock. For example, the timing circuit 100 may set a transmitter's clock as a reference clock and lock the receiver's system clock (also referred to herein as a local clock) to that of the transmitter so that an audio signal transmitted through an MPEG-2 (Moving Picture Experts Group, part 2) stream remains synchronized. Timing circuit 100 may include, for example, a phase detector 101, a filter 103, a signal generator 105, and a counter 107. In some embodiments, the timing circuit 100 may retrieve a clock signal associated with an incoming data stream to use as a reference signal (in the illustrative embodiment, the Program Clock Reference [PCR]). Timing circuit 100 may compare the reference clock signal with the device's own local clock signal, producing an error signal that the timing circuit 100 may minimize in order to lock the receiver's local clock with the clock of the transmitter, represented by timing packets extracted from the MPEG-2 stream.

Phase detector 101 may receive a reference clock signal and a local clock signal and may produce an error signal by comparing the two received signals. In some embodiments, the phase detector 101 may be a circuit or hardware device that retrieves the timing packets included in an MPEG-2 stream sent from a transmitter. In some embodiments, other components of the receiver may extract timing packets from a plurality of packets included in the MPEG-2 stream. The timing packets included in the MPEG-2 stream may represent timing (e.g., frequency and phase) of the transmitter clock; the phase detector 101 may use the representation of the transmitter clock as the Program Clock Reference (PCR) or System Clock Reference (SCR) to compare with the local system clock. Timing circuit 100 may then adjust the output of the local clock to better match that of the reference clock. In some instances, this may require multiple adjustments before the frequencies and/or phases of the reference clock and the local clock lock into a set relationship. In some embodiments, there may be a 1:1 ratio between the clocks so that both the reference signal and the local clock signal operate at the same frequency. In some embodiments, there may also be a constant phase difference that remains locked after the correction of the timing circuit 100. In alternative embodiments, the local clock may operate at a different frequency so that, for example, the timing circuit 100 may, over time, lock the frequencies in a set ratio, such as a 1:3 ratio so that when the reference operates at a 27 MHz frequency, the local clock signal is at a 81 MHz frequency.

In some embodiments, the phase detector 101 may produce a value based on its comparison of the PCR and the local clock; for example, in some embodiments, the phase detector 101 may be a subtractor that produces an error signal equal to the difference between the reference clock signal and the local clock signal. In some embodiments, the error signal produced by the phase detector 101 may include both a fixed delay (e.g., a set phase difference) and a statistical delay. In such instances, the timing circuit 100 may, over time, minimize the statistical delay, while other components in the receiver and/or transmitter may account for the fixed delay, which may still enable sufficient clock stabilization between the transmitter and the receiver.

Filter 103 may receive the error signal and produce a control signal for the signal generator 105. In some embodiments, the filter 103 may comprise multiple filter stages that may be used to modify the received error signal into the control signal for the oscillator. Filter 103 may in such instances determine the loop dynamics of the timing circuit 100 and may be designed based on the characteristics of the reference signal. For example, the filter 103 may include a buffer stage with a proportional constant that produces a proportional gain or attenuation of the error signal, which is used as an input. In some embodiments, the filter 103 may include other filter elements, such as a low pass filter which produces a signal that is an integral of the input error signal. The components of the filter 103 may be based on the type and order that characterize the system. In some embodiments, the filters that constitute the filter 103 may be connected in parallel, with a summer adding the produced components together to produce the control signal.

Signal generator 105 may receive the control signal from the filter 103 and may generate a local clock frequency in response to the received control signal. In some embodiments, the signal generator 105 may be an adjustable oscillator, such as a voltage-controlled oscillator. In such instances, the signal generator 105 may include a bias generator, a voltage-controlled oscillator, and an output converter connected in series. As the amplitude of the control signal increases, the signal generator 105 may have its output frequency driven in the opposite direction; such negative adjustments may enable the timing circuit 100 to compensate for the calculated error, reducing the amplitude of the error signal over time. The local clock frequency produced by the signal generator 105 may be the same or a non-zero integer multiple of the frequency of the reference clock. For example, if the PCR has a frequency of 27 MHz, the signal generator 105 may, over time, receive a control signal that will cause the signal generator 105 to produce a local clock with a frequency of 27 MHz. In alternative embodiments, the signal generator 105 may, for example, produce a local clock with a frequency of 81 MHz.

Counter 107 may be one or more components of the feedback path that receive the local clock frequency produced by the signal generator 105 and produce a modified system clock signal that functions as the local clock signal for the input of the phase detector 101. In some embodiments, the counter 107 may comprise one or more hardware components, such as connected D flip-flops. In some embodiments, the counter 107 may be initially loaded with the reference frequency, so that it increments at the reference frequency when receiving the local clock signal. In such instances, the counter 107 may initially count at the reference frequency rate so that when the counter 107 increments based on the local clock frequency, the two clock signals have the same start value. When the local clock frequency and the reference clock frequency are of the same scale, the counter 107 may simply increment based on the edges of the local clock signal produced by the signal generator 105, producing the same frequency as that produced by the signal generator 105.

In some embodiments, the local clock frequency produced by the signal generator 105 may be of a different scale than that of the reference frequency, such as a non-zero integer multiple of the reference frequency. In such instances, the counter 105 may be a divide-by-N counter that increments after every N edges of the local clock frequency, producing a local clock signal with the same frequency as the reference clock signal.

In the illustrative embodiment, for example, if the initial reference clock signal has a frequency of 27 MHz and the local clock signal has an initial frequency of 25 MHz, the phase detector 101 may produce an error signal with a frequency based on the calculated difference of 2 MHz. In some embodiments, the phase detector 101 may produce the error signal including amplitude (in voltage) that is proportional to its frequency. Filter 103 may apply one or more filter stages to the error signal to produce a control signal that may be used to compensate for the detected error.

The control signal produced by the filter 103 may then be received by the signal generator 105, which may adjust its output local clock frequency in response to the control signal. The output of the signal generator 105 may serve as the receiver's clock signal, while also being fed into the counter 107 as part of the feedback loop for the timing circuit 100. The counter 107 may be loaded with the reference signal and increment the counter at the reference frequency rate, while receiving the local clock frequency from the signal generator 105. The counter 107 may then produce the local clock signal at a similar frequency to the reference clock signal, which may then be sent to the phase detector 101, which may again compare the reference clock signal to the new local clock signal.

Figure 2:
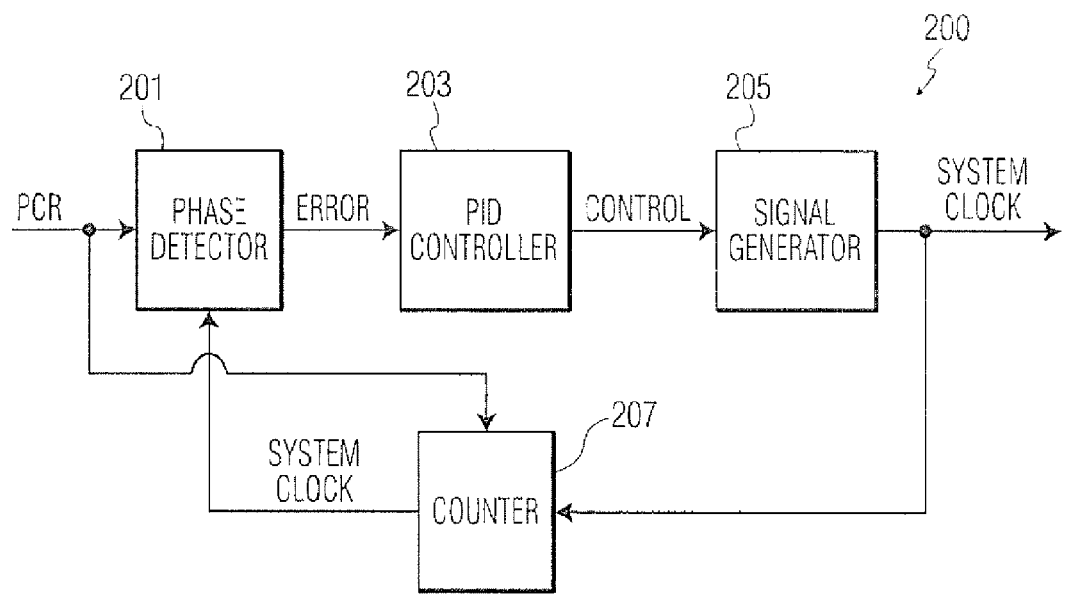
FIG. 2 illustrates an exemplary timing circuit that includes a PID controller.

FIG. 2 illustrates an exemplary timing circuit 200 that includes a PID controller 203. Timing circuit 200 may be similar to the timing circuit 100, with included components, such as the phase detector 201, signal generator 205, and counter 207 acting in a similar manner to like components in the timing circuit 100. PID controller 203 may replace the filter 103 in the timing circuit 200, with the PID controller 203 adding better control in producing an appropriate control signal for the signal generator 205. In some embodiments, the timing circuit 200 may be used to synchronize the transmitter and receiver. For example, the timing circuit 200 may use time stamps from a transmitter clock and a receiver clock to enable digital clock synchronization; this may enable digital clock audio synchronization when digital audio is transmitted.

Proportional-Integral-Derivative (PID) controller 203 receives the error signal from the phase detector 201 and includes various components that control the loop dynamics of the timing circuit 200, producing a control signal that causes the signal generator 205 to output a local clock signal that will cause the error signal to reduce to zero over a shorter time period. PID controller 203 may comprise one or more hardware components that may separately receive the error signal and produce compensation signals by modifying the error signal using various methods. The resultant compensation signals may be combined to produce the control signal for the signal generator 205. PID controller 203 may enable the timing circuit 200 to produce an local clock frequency that matches the reference frequency with more accuracy and less overshoot than the filter 103 in timing circuit 100, as the filter 103 may include only a gain buffer and/or a low-pass filter.

Figure 3:
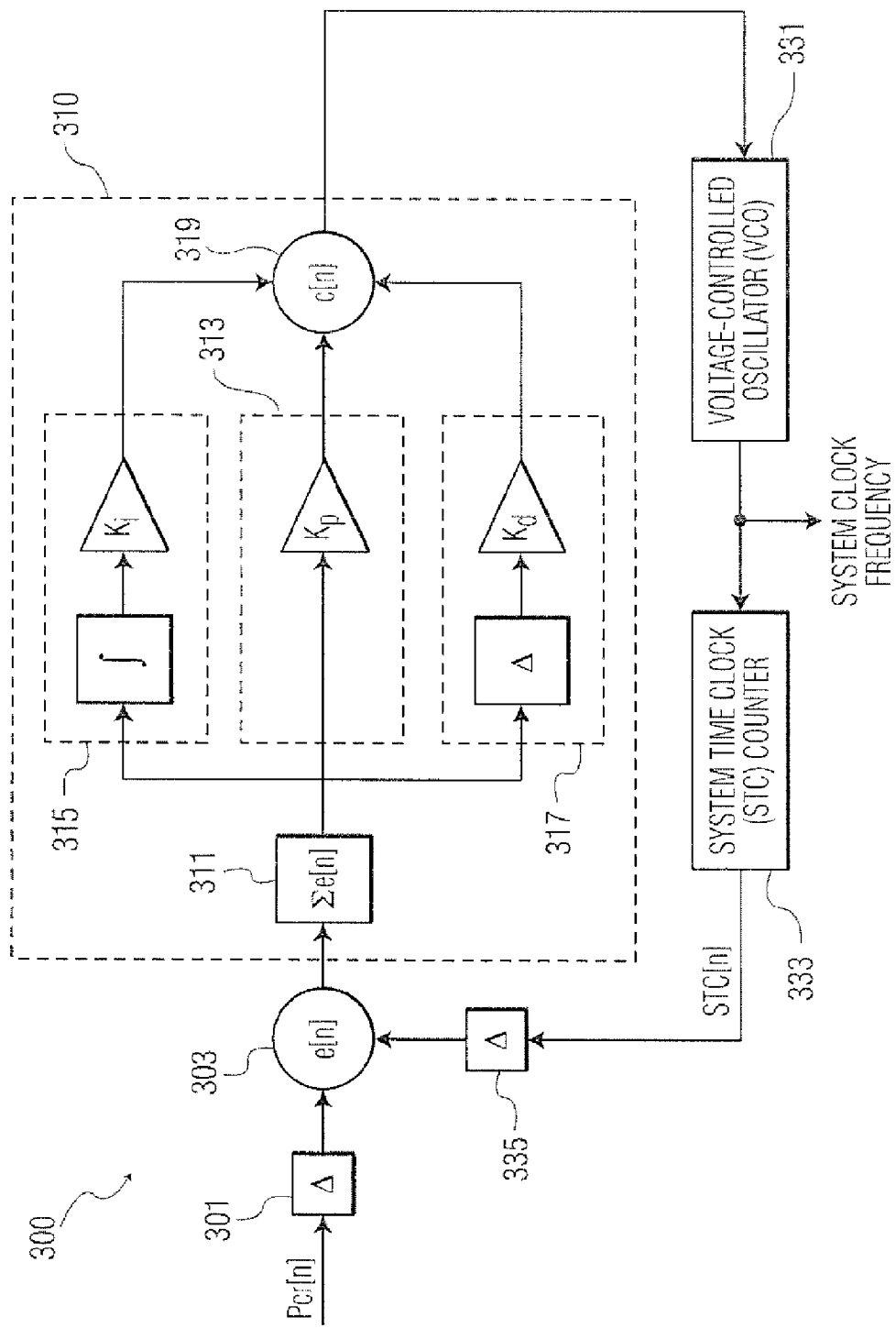
FIG. 3 illustrates a more detailed version of the timing circuit including the PID controller.

FIG. 3 illustrates a more detailed version of the timing circuit including the PID controller. Timing circuit 300 may contain all components of the timing circuit 200; however, the system time clock (STC) counter 333 does not receive the reference clock signal. As a result, the timing circuit 300 compares the differentials of the respective clock signals instead of the signals themselves. For example, the phase detector 303 may, instead of comparing the reference clock signal ($C_R$) with the local clock signal ($C_L$), compare the differential reference clock signal ($\Delta C_R$) with the differential local clock signal ($\Delta C_L$).

In the illustrative embodiment, the timing circuit includes differentiators 301 and 335, a phase detector 303, a PID controller 310, voltage-controlled oscillator (VCO) 331, and STC counter 333. PID controller 310 may include a differential error summer 311, a proportional gain branch 313, an integral gain branch 315, a derivative gain branch 317, and a compensation summer 319. Each of the branches 313-317 may receive the accumulated error signal produced by the differential error summer 311. The compensation summer 319 may produce a manipulated variable (MV), which may equal the sum of the branches 313-317. In some embodiments, the MV may be equal to the control signal produced by the PID controller 310 that is sent to the VCO 331.

Phase detector 303 may receive the differential reference clock signal produced by the differentiator 301 and the differential local clock signal produced by the differentiator 335 and may produce an error signal by comparing the two received signals. In some embodiments, this error signal is a difference of a differential (i.e., $\Delta C_R - \Delta C_L$) and may therefore be too small to produce a control signal that effectively adjusts the VCO 331. As a result, the differential summer 311 may be used in some instances to accumulate these error signal values over time so that they accumulate to a non-negligible value that the PID controller branches 313-317 could use to produce compensation signals for a control signal. Differential summer 311 may in some embodiments send copies of the accumulated error signal to each of the PID controller branches 313-317.

Proportional branch 313 may comprise a gain buffer including a proportional gain constant that receives the accumulated error signal from the differential summer 311 and may produce a proportional output $P_{out}$ that is equal to the product of the accumulated error term e(t) and the proportional gain constant $K_p$. In some embodiments, a high proportional gain constant may result in a large control signal and large changes in the local clock signal for a given change in the error signal. As a result, if the proportional gain constant is too low, the timing circuit 300 may not be able to effectively respond to the accumulated error signal. However, an overly-high proportional gain constant may, when acting alone, cause the timing circuit 300 to overshoot when making corrections, without any gain in the speed of the response. A person of skill in the art would be aware of tuning methods, such as the Ziegler-Nichols tuning formula and set-point optimum PID tuning, for choosing an appropriate proportional gain constant for the PID controller stage 313.

Integral branch 315 may comprise of an integrator connected in series with a gain buffer including an integral gain constant that receives the accumulated error signal from the differential summer 311 and may produce an integral output $I_{out}$ that is equal to the product of the integral of the accumulated error term e(t) over a defined time interval t ($\int_0^t e(\tau) d\tau$), and an integral gain constant $K_i$. The integral output may be expressed as:

$$I_{out} = K_i \int_0^t e(\tau) d\tau + B$$

Where B is a constant. In some embodiments, the integral branch 315 may produce a sum of discrete values, such as when the timing circuit 300 comprises an analog circuit that adds discrete time stamps associated with the clocks of the MPEG stream. In some embodiments, the integral output may be added with the proportional output to produce a control signal that accelerates local clock frequency matching that of reference frequency. The integral output may also eliminate any residual steady-state offset error that may result from only the proportional output. Similar to the choice of proportional gain constant, some integral gain constants may also produce a control signal that causes the signal generator 205 to overshoot the target frequency. Such overshoot may be the result of the integral branch 315 responding to an accumulation of accumulated error signal (i.e., $\iint_0^t e(\tau) d\tau$). Similar tuning methods for choosing an optimal proportional gain constant may also be used to choose an optimal integral gain constant.

Derivative branch 317 may comprise a differentiator in series with a gain buffer including a derivative gain constant that receives the accumulated error signal from the differential summer 311 and may produce a derivative output $D_{out}$ that is equal to the product of the derivative of the accumulated error value with respect to time $$\left( \frac{d}{dt} e(t) \right)$$

and a derivative gain constant Kt. This may be expressed as:

$$D_{out} = K_d \frac{d}{dt} e(t)$$

In some embodiments, the derivative branch 317 may produce a value that is the result of a difference between discrete values, such as when the timing circuit 300 comprises an analog circuit that subtracts discrete time stamps associated with the clocks of the MPEG stream. In some embodiments, the derivative output may slow the rate of change of the control signal and the resultant local clock signal. The derivative output may, in some instances, mitigate the overshoot that may occur from the proportional output and/or the integral output. However, the derivative output may also be highly sensitive to noise, depending on the value of the derivative gain constant. Similar tuning method for choosing optimal proportional and integral gain constants may also be used to select an optimal derivative gain constant.

Compensation summer 319 may receive the proportional output from the proportional gain stage 313, the integral output from the integral gain stage 315, and the derivative output from the derivative gain stage 317. Compensation summer 319 may then produce a manipulated variable equal to the sum of these outputs:

$$MV = K_p e(t) + K_i \int_0^t e(\tau) d\tau + K_d \frac{d}{dt} e(t)$$

In such embodiments, the manipulated variable may be equal to the control signal produced for the VCO 331. In some embodiments, the control signal may have an amplitude that is proportional to the frequency.

VCO 331 may be an adjustable oscillator that receives the control signal from the compensation summer 319 of the PID controller 310 and produces a local clock signal with a frequency (in the illustrative embodiment, the system time clock) based on the received control signal. In some embodiments, the VCO 331 may determine the output frequency included in the local clock signal based on the amplitude (in voltage) of the input control signal.

STC counter 333 may increment based on the edges in of the local clock signal received from the VCO 331. In the illustrative embodiment, the STC counter 333 does not receive the reference clock signal, so the reference STC counter 333 is unable to start at the reference frequency. However, loading the reference frequency into the STC counter 333 is not necessary, as the phase detector 303 compares differential clock signals. As the phase detector 303 only compares differentials, they do not need to begin at the same start value, obviating initial loading of the reference frequency.

Over time, both the error signal produced by the phase detector 303 and the accumulated error signal produced by the differential error summer 311 may trend towards zero values. In some embodiments, the timing circuit 300 may settle at non-zero values for the error signal produced by the phase detector 303 and/or the accumulated error signal produced by the differential error summer 311 in order to avoid overshoot should the local clock signal drift again.

Figure 4:
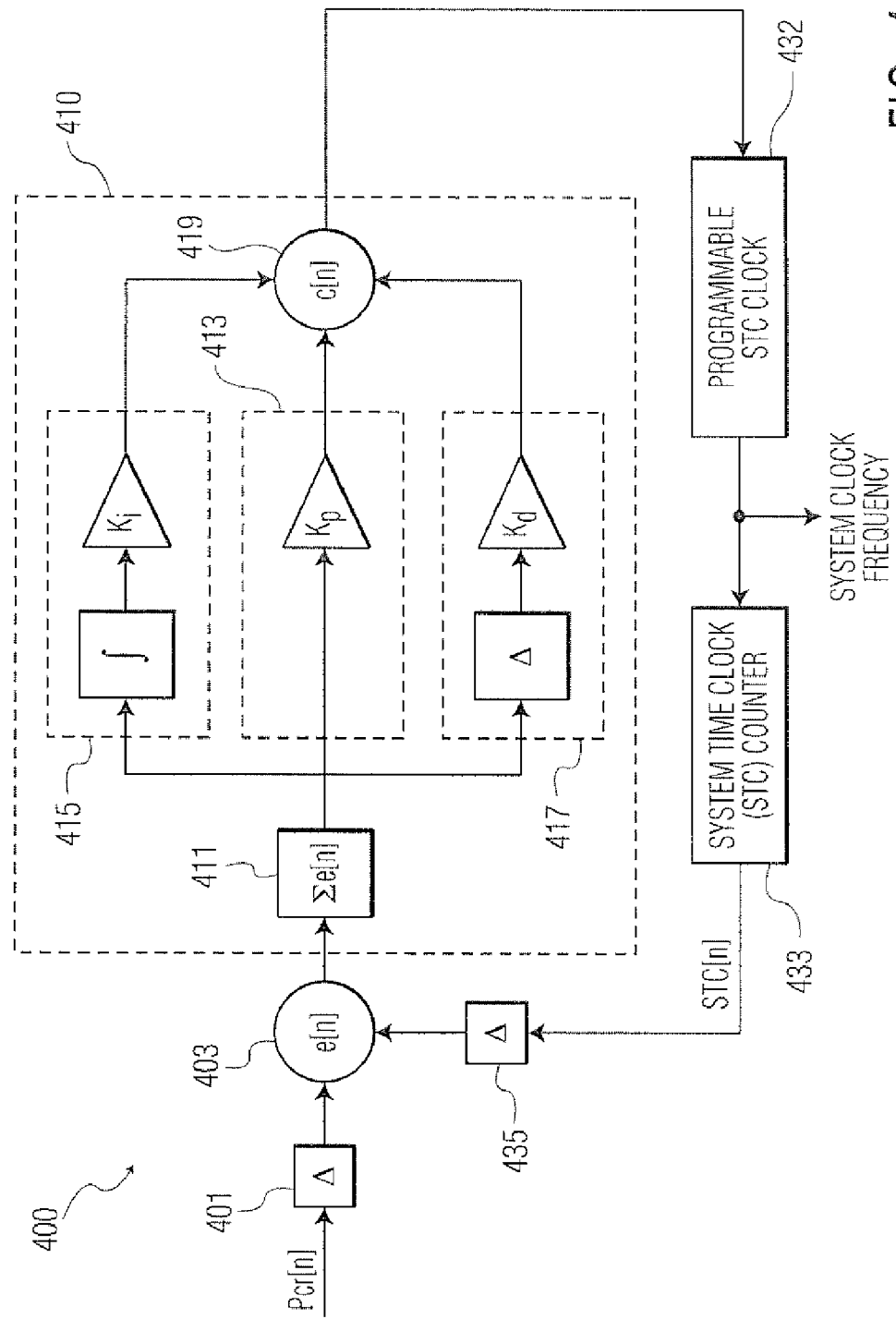
FIG. 4 illustrates an alternative timing circuit including a programmable clock.

FIG. 4 illustrates an alternative timing circuit including a programmable clock. Timing circuit 400 is similar in operation to the timing circuit of 300, using differential clock signals to adjust the local clock frequency without initially loading the STC counter 433 with the reference clock frequency. However, the timing circuit 400 has a programmable STC clock 432 replacing the VCO 331 to produce the local clock signal.

In the illustrative embodiment, the programmable STC clock 432 includes a crystal clock that receives the control signal and produces the local clock signal that increments the STC counter 433. The local clock signal (i.e., the STC signal, STC[n]) may therefore be derived from the STC counter 433 to run at the reference clock frequency. This may include various software and hardware methods known to one of skill in the art.

In some embodiments, the frequency of the STC clock 432 may be additionally controlled by hardware or software. In such instances, the output of the STC clock 432 may be corrected by the control signal and/or commands from a software module, depending, for example, on the control signal produced by the PID controller 410. In some embodiments, the error signal produced by the phase detector 403 and the accumulated error produced by the differential summer 411 may be used to program the software module that adjusts the output of the STC clock 432. This may be an additional way for the output of the STC clock 432 to depend on the reference frequency.

Figure 5:
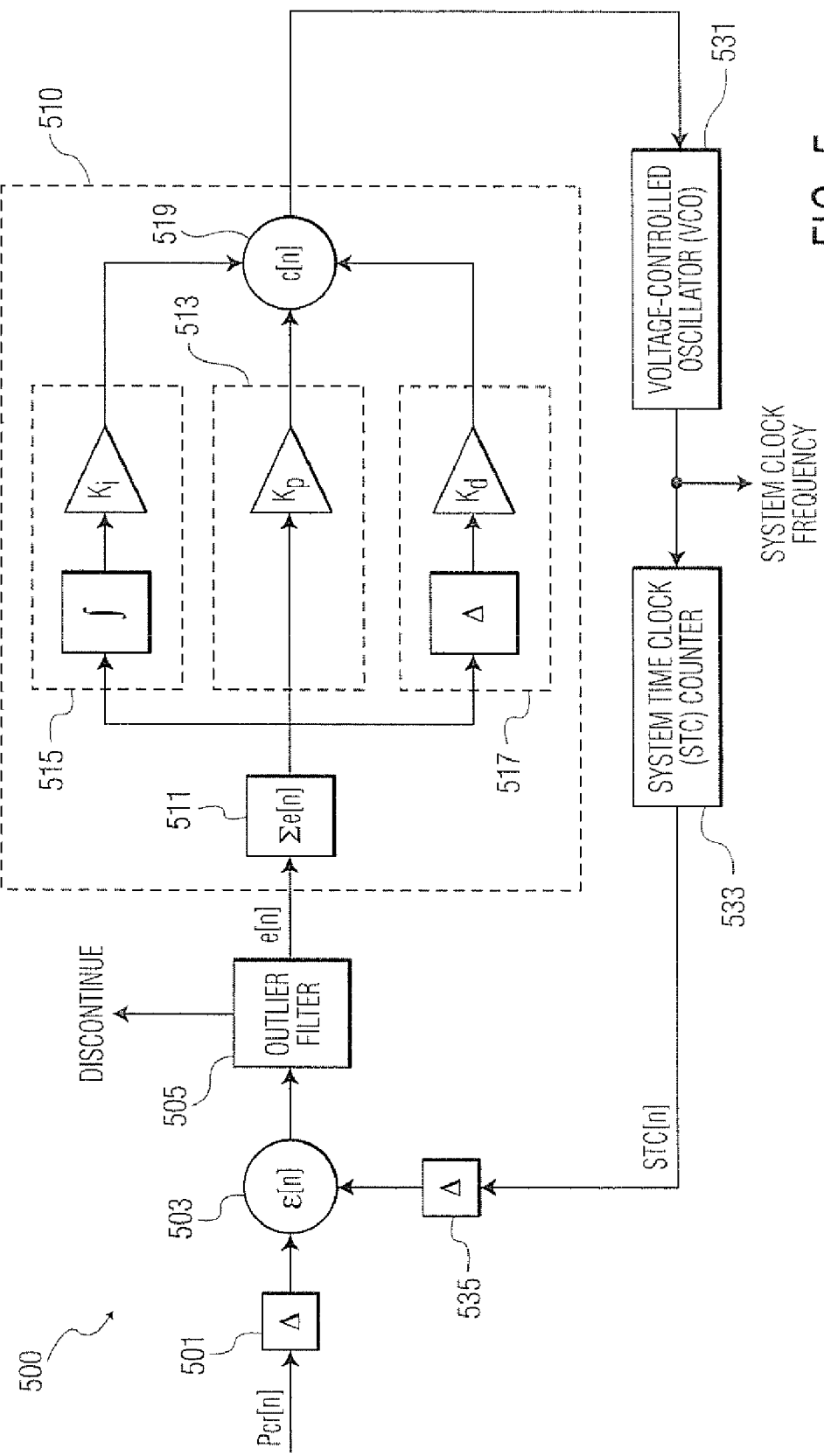
FIG. 5 illustrates an alternative timing circuit including an outlier filter.

FIG. 5 illustrates an alternative timing circuit including an outlier filter. The outlier filter 505 removes outliers, for example, acting as a bandpass filter that allows a limited range of errors. Timing circuit 500 may be similar to the timing circuit 300, with similar components and the addition of an outlier filter 505. In some embodiments, the timing circuit 500 may be most effective when correcting for errors within a certain defined range; the receiver may use the timing circuit 500 for fine synchronization between the reference clock of the transmitter and the local clock of the receiver. Outlier filter 505 may be included in series between the phase detector 501 and the PID controller 510 for coarse synchronization, as the outlier filter 505 may reject errors that are outside the defined range.

For example, the outlier filter 505 may receive an error signal from the phase detector 501 and use a discontinue function to determine whether the error signal is within the defined range. Such a discontinue function may be set as:

$$Discont.[n] = \begin{cases} 0 & |\varepsilon[n]| \le \theta \\ 1 & |\varepsilon[n]| > \theta \end{cases}$$

Where θ represents the maximum phase angle for the error signal produced by the phase detector 501. If the absolute value is below the defined angle, the discontinue function produces a zero value so that the error signal is acceptable to pass through to the PID controller 510. Otherwise, the discontinue function will produce a one value when the error signal is outside the defined angle, causing the outlier filter 505 to discontinue processing the error value. In some embodiments, the outlier filter 505 may drop the error signal when it is determined that it is outside the defined range.

Figure 6:
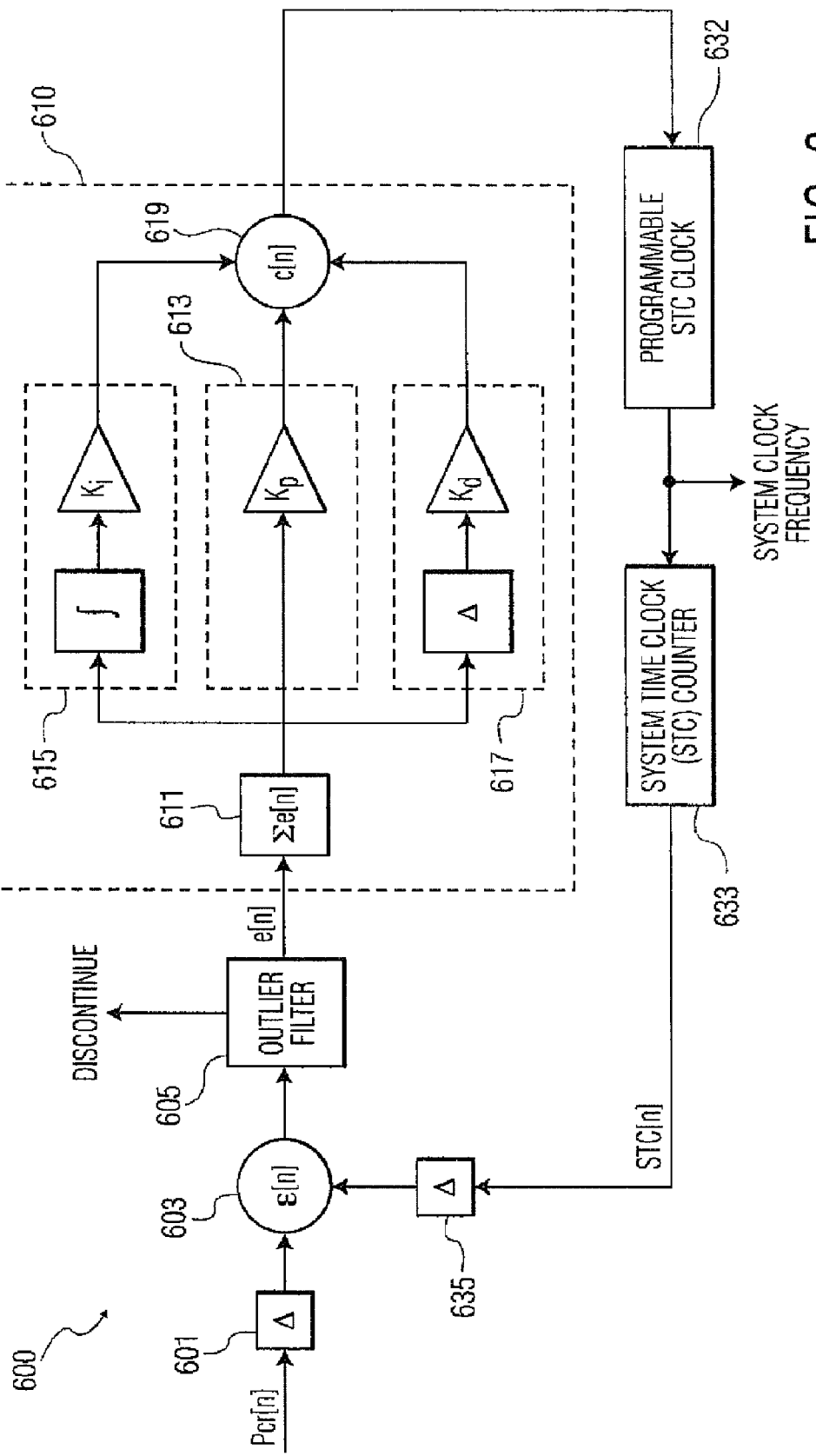
FIG. 6 illustrates an alternative timing circuit including an outlier filter and a programmable clock.

FIG. 6 illustrates an alternative timing circuit including an outlier filter and a programmable clock. Timing circuit 600 acts in a similar manner to both the timing circuit 400 and the timing circuit 500, as it includes both a programmable STC clock 632 and an outlier filter 605.

It should be apparent from the foregoing description that various exemplary embodiments of the invention may be implemented in hardware and/or firmware. Furthermore, various exemplary embodiments may be implemented as instructions stored on a tangible machine-readable storage medium, which may be read and executed by at least one processor to perform the operations described in detail herein. A tangible machine-readable storage medium may include any mechanism for storing information in a form readable by a machine, such as a personal or laptop computer, a server, or other computing device. Thus, a tangible machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A phase-locked loop (PLL) circuit for transmitter-receiver synchronization, the PLL comprising:
   a phase detector that produces an error signal based on a difference between a reference clock signal difference ($\Delta$CR) and a local clock signal difference ($\Delta$CL);
   a proportional-integral-derivative (PID) controller that receives the error signal from the phase detector and produces a correction signal;
   a signal generator that produces the local clock signal based on the correction signal received from the PID controller; and
   a feedback counter that increments based on the local clock signal to produce a modified local clock signal for the phase detector.

2. The PLL circuit of claim 1, wherein the signal generator comprises a voltage-controlled oscillator (VCO) that produces the local clock signal based on a voltage of the correction signal.

3. The PLL circuit of claim 1, wherein the signal generator comprises a programmable clock that produces the local clock signal based on the correction signal and the error signal.

4. The PLL circuit of claim 1, further comprising:
   a differential summer in series between the phase detector and the PID controller that accumulates the error signals produced by the phase detector and produces an accumulated error signal.

5. A phase-locked loop (PLL) circuit for transmitter-receiver synchronization, the PLL comprising:
   a phase detector that produces an error signal based on a difference between a reference clock signal difference ($\Delta$CR) and a local clock signal difference ($\Delta$CL);
   an outlier filter that receives the error signal from the phase detector, wherein the outlier filter forwards error signals within a defined range and discontinues error signals outside the defined range;
   a proportional-integral-derivative (PID) controller that receives the error signal from the outlier filter and produces a correction signal;
   a signal generator that produces the local clock signal based on the correction signal received from the PID controller;
   a feedback counter that increments based on the local clock signal to produce a modified local clock signal for the phase detector.

6. The PLL circuit of claim 1, wherein the reference clock signal is included in a stream of MPEG-2 packets.

7. The PLL circuit of claim 6, wherein the PLL circuit is included in a receiver that receives the stream of MPEG-2 packets from a transmitter.

8. The PLL circuit of claim 1, wherein the feedback counter receives the reference clock signal and produces the modified local clock signal based on the local clock signal and the reference clock signal.

9. A method of using a phase-locked loop (PLL) circuit for transmitter-receiver synchronization, the method comprising:
   receiving, by a phase detector, a reference clock signal difference ($\Delta$CR) and a local clock signal difference ($\Delta$CL);
   producing, by the phase detector, an error signal based on a difference between the reference clock signal difference ($\Delta$CR) and the local clock signal difference ($\Delta$CL);
   producing, by a proportional-integral-derivative (PID) controller, a correction signal based on the error signal received from the phase detector;
   producing, by a signal generator, a modified local clock signal based on the correction signal received from the PID controller; and
   producing, by a feedback counter, the local clock signal for the phase detector by incrementing based on the local clock signal received from the signal generator.

10. The method of claim 9, wherein the signal generator comprises a voltage-controlled oscillator (VCO) that produces the local clock signal based on a voltage of the correction signal.

11. The method of claim 9, wherein the signal generator comprises a programmable clock that produces the local clock signal based on the correction signal and the error signal.

12. The method of claim 9, further comprising:
   producing, by a differential summer in series between the phase detector and the PID controller, an accumulated error signal by accumulating the error signals produced by the phase detector.

13. A method of using a phase-locked loop (PLL) circuit for transmitter-receiver synchronization, the method comprising:
   producing, by a phase detector, an error signal based on a difference between a reference clock signal difference ($\Delta$CR) and a local clock signal difference ($\Delta$CL);
   receiving, by an outlier filter, the error signal from the phase detector; determining, by the outlier filter, whether the error signal is within a defined range;
   forwarding the error signal to a proportional-integral-derivative (PID) controller when it is within the defined range; and
   discontinuing the error signal when it is outside the defined range;
   producing, by the PID controller, a correction signal based on the error signal received from the outlier filter;
   producing, by a signal generator, a modified local clock signal based on the correction signal received from the PID controller; and
   producing, by a feedback counter, the local clock signal for the phase detector by incrementing based on the local clock signal received from the signal generator.

14. The method of claim 9, wherein the reference clock signal is included in a stream of MPEG-2 packets.

15. The method of claim 14, further comprising:
receiving, by the phase detector, the stream of MPEG-2 packets from a transmitter, wherein the PLL circuit is included in a receiver that receives the stream of MPEG-2 packets.

16. The method of claim 9, further comprising:
receiving, by the feedback counter, the reference clock signal, wherein the feedback counter produces the modified local clock signal based on the local clock signal and the reference signal.

17. A circuit for transmitter-receiver synchronization comprising:
a phase detector that produces an error signal based on a difference between a reference clock signal difference ($\Delta CR$) and a local clock signal difference ($\Delta CL$);
a filter that receives the error signal from the phase detector and produces a modified signal;
a proportional-integral-derivative (PID) controller that receives the modified signal from the filter and produces a correction signal;
a clock signal generator that produces a system clock signal based on the correction signal received from the PID controller; and
a feedback counter that produces the local clock signal based on the system clock signal.

18. The circuit of claim 17, further comprising:
a differential summer in series between the phase detector and the PID controller that accumulates the error signals produced by the phase detector and produces an accumulated error signal.

* * * * *